United States Patent [19]

Kitagawa

[11] Patent Number: 5,090,122
[45] Date of Patent: Feb. 25, 1992

[54] METHOD FOR MANUFACTURING A THREE-DIMENSIONAL CIRCUIT SUBSTRATE

[75] Inventor: Hiroji Kitagawa, Nagoya, Japan
[73] Assignee: Kitagawa Industries Co., Ltd., Japan
[21] Appl. No.: 651,277
[22] Filed: Feb. 5, 1991

[30] Foreign Application Priority Data

Jul. 24, 1990 [JP] Japan .................. 2-198352

[51] Int. Cl.$^5$ ............................................. H01K 3/10
[52] U.S. Cl. ...................................... 29/852; 29/848; 156/285
[58] Field of Search ................... 29/848, 852; 264/510; 156/285, 233

[56] References Cited

U.S. PATENT DOCUMENTS

| | | | |
|---|---|---|---|
| 4,127,436 | 11/1978 | Friel | 156/285 X |
| 4,407,685 | 10/1983 | Hankland | 156/285 X |
| 4,463,055 | 7/1984 | Hodges | 156/285 X |
| 4,584,767 | 4/1986 | Gregory | 29/848 |
| 4,647,005 | 2/1987 | Seifert | 156/233 X |
| 4,927,733 | 5/1990 | Stout | 156/285 X |
| 4,944,087 | 7/1990 | Landi | 29/848 |
| 4,944,908 | 7/1990 | Leveque et al. | 29/848 X |
| 4,985,116 | 1/1991 | Mettler et al. | 156/285 X |

*Primary Examiner*—Carl J. Arbes
*Attorney, Agent, or Firm*—Davis, Bujold & Streck

[57] ABSTRACT

This invention provides a method for manufacturing a three-dimensional circuit substrate. In the method, a conducting portion comprising a circuit pattern is formed on the surface of a film. The film is placed over a resin board in a mold in which the conducting portion of the film is opposed to the resin board. Subsequently, blow molding or vacuum forming is applied to the mold. The film and the resin board are thus closely overlapped, heat-bonded, and formed into the three-dimensional circuit substrate having a desired configuration. Through such minimum process steps, the three-dimensional circuit substrate with the complicated configuration can be manufactured easily with reduced cost.

9 Claims, 2 Drawing Sheets

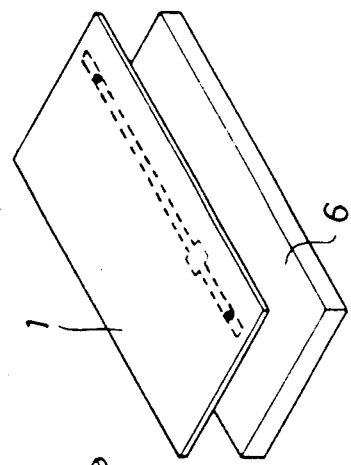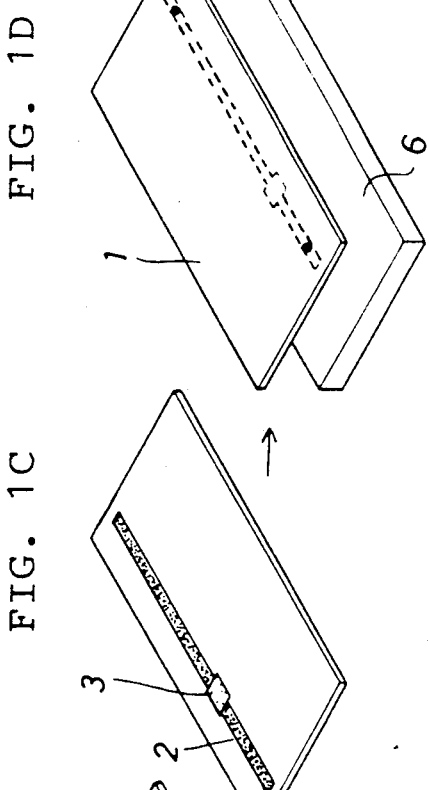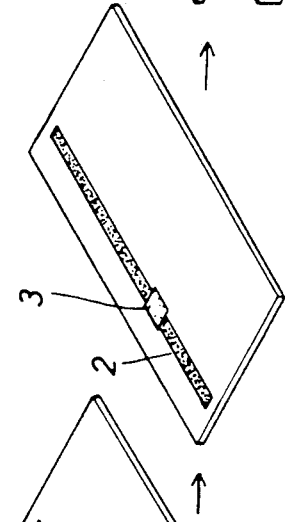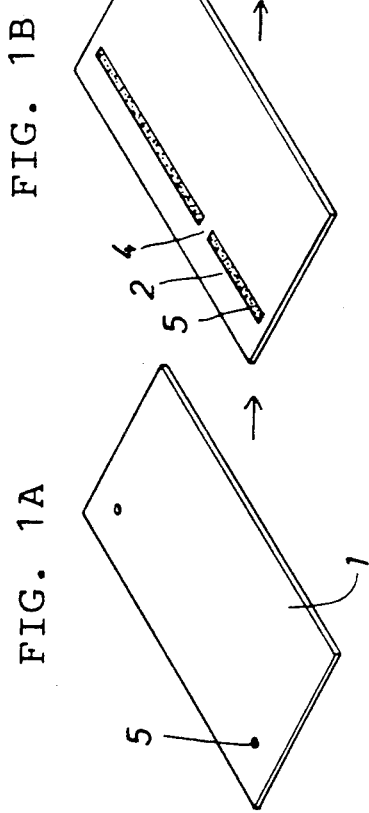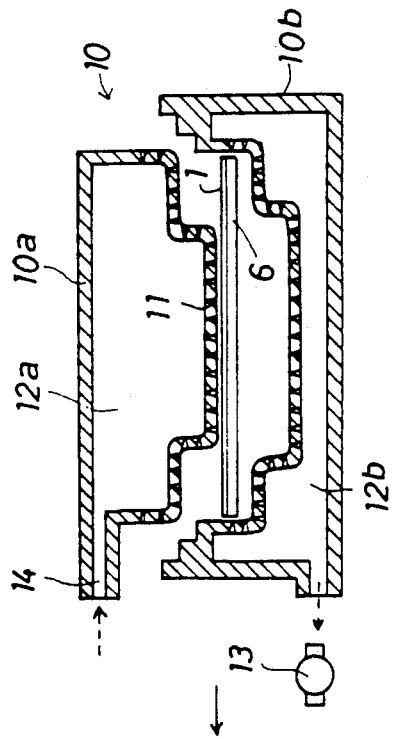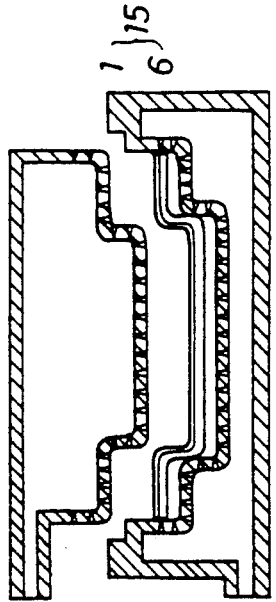

METHOD FOR MANUFACTURING A THREE-DIMENSIONAL CIRCUIT SUBSTRATE

BACKGROUND OF THE INVENTION

This invention relates to a method for manufacturing a three-dimensional circuit substrate.

Conventionally, flat pieces of circuit substrate have been used and are generally referred to as printed circuit boards or PCBs; however, a circuit substrate having various three-dimensional configurations and a method for manufacturing the circuit substrate could enhance the precision and reliability of various electric components connected to the circuit substrate.

The manufacturing of a three-dimensional circuit substrate through two-composition molding is known in the art. In this method, a solid, on which electroless plating can be applied, is first molded through injection molding by using resin with a plating catalyst mixed therein. Second, a layer, on which electroless plating is not applied, is formed on a given surface of the molded solid through another injection molding process using another resin without the plating catalyst. Last, the electroless plating is applied onto the solid except the layer. A conducting portion is thus formed on the desired surface of the molded solid.

In another known method, a solid is first molded by using resin which can be plated electrolessly. Subsequently, photo-resist is applied on the surface of the molded solid and a circuit pattern is exposed. After the photo-resist is partially removed through etching, electroless plating is applied on the etched surface of the molded solid, thereby forming a three-dimensional circuit substrate.

In another known method, a three-dimensional substrate is formed and a circuit pattern is transferred onto the surface of the three-dimensional substrate using a transfer film.

The forming of a conductive portion comprising a circuit pattern on the given surface of a three-dimensional substrate through vacuum evaporation has also been proposed.

The above mentioned methods, however, involve intricate process steps such as injection molding with the resin including the plating catalyst, the forming of the circuit pattern with transfer film, or vacuum evaporation. A three-dimensional substrate according to these prior art techniques is thus difficult to manufacture.

Wherefore, an object of this invention is to provide a method that can easily manufacture a three-dimensional circuit substrate comprising a complicated circuit pattern.

Other objects and benefits of the invention will become apparent from the detailed description which follows hereinafter when taken in conjunction with the drawing figures which accompany it.

SUMMARY OF THE INVENTION

To solve this and other objects, the invention provides a method for manufacturing a three-dimensional circuit substrate. The method comprises the steps of forming a conducting portion on a surface of a film member as a top material, disposing the film member with the conducting portion opposite to a resin member as a base material in a mold, overlapping and bonding the film member and the resin member through blow molding or vacuum forming, and thereby forming a three-dimensional circuit substrate.

The film member is preferably a film or a sheet of a resin composed of an amorphous polymer such as ABS resin, polycarbonate, or polyether sulfone. The resin member is preferably a board material composed of the same material as that of the film member. The conducting portion can be composed of copper, silver and other conductive metals. A resisting portion comprising graphite mainly can be formed on the conducting portion.

BRIEF DESCRIPTION OF THE DRAWINGS

FIGS. 1A, 1B, 1C, 1D, 1E and 1F are explanatory views showing process steps of a method for manufacturing a three-dimensional circuit substrate embodying the present invention.

DETAILED DESCRIPTION OF THE PREFERRED EMBODIMENT

Figure 2:
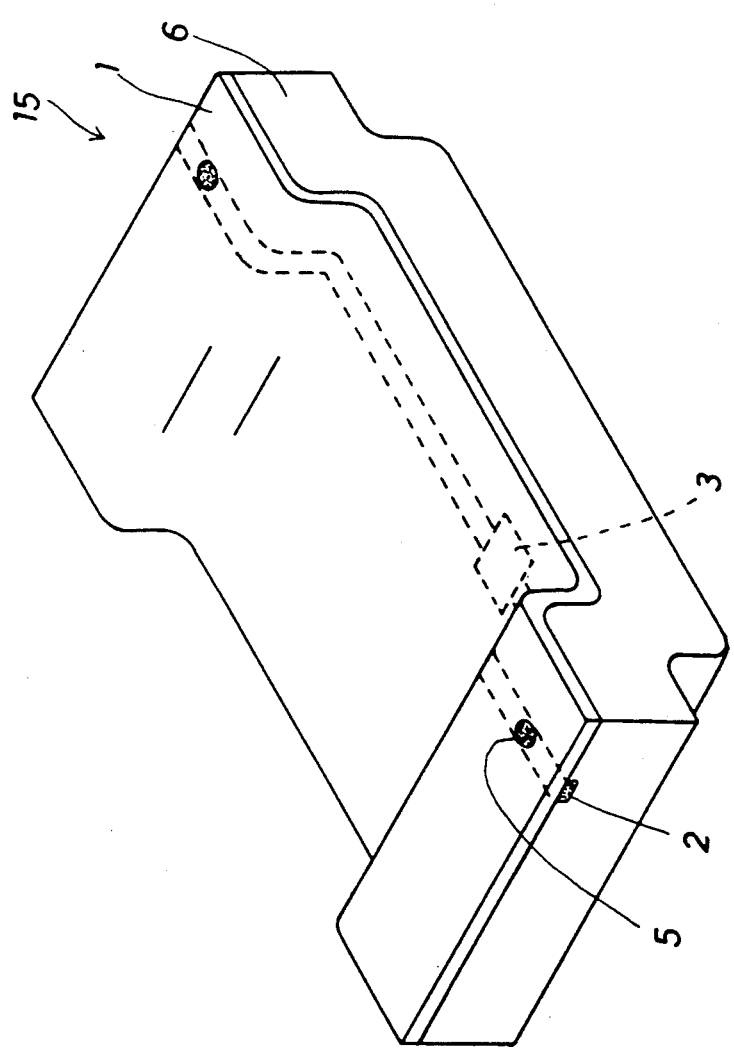
FIG. 2 is a perspective view of the three-dimensional circuit substrate.

A method for manufacturing a three-dimensional circuit substrate according to the present invention will now be explained with particular reference to FIGS. 1A through 1F.

FIRST PROCESS STEP: FORMING OF CONNECTING HOLES

FIG. 1A illustrates the forming of holes 5 for connecting terminals on a film 1. The holes 5 having a diameter of 1 mm are formed in the given portions of the film 1 comprising a 1 mm thick ABS resin, such that a conducting portion 2, which is formed at the next process step, is exposed through the holes 5 at the back of the film 1.

SECOND PROCESS STEP: FORMING OF CONDUCTING PORTION

FIG. 1B illustrates the forming of the conducting portions 2 for wiring on the film 1. The conducting portions 2 with their ends adjacent to the holes 5 are formed through silk-screen printing using conductive ink. The conductive ink is a pasted ink consisting of 75% of cooper particles, 20% of binder, and 5% of carbon fiber having a diameter of 0.1 $\mu$m and a length of 10 $\mu$m. The conducting portions 2 thus formed are 1 mm wide and 20 $\mu$m thick and interrupted by a gap 4 to be covered by a resisting portion 3 described later.

THIRD PROCESS STEP: FORMING OF RESISTING PORTION

FIG. 1C illustrates the forming of the resisting portion 3 over the gap 4 in the conductive portions 2. The resisting portion 3 is printed over the gap 4 using ink comprising 75% of graphite and 25% of binder. Subsequently, the resisting portion 3 is dried, thereby completing the conducting portion 2.

FOURTH PROCESS STEP: FORMING OF BOARD

FIG. 1D illustrates the forming of a board 6 overlapping the film 1. The board 6 is formed 5 mm thick from ABS resin. Since the film 1 and the board 6 require compatibility when overlapped and heat-bonded as described later, the material of the film 1 is preferably the same as that of the board 6. However, since the board 6 is thicker than the film 1, the board 6 should have low viscosity while the film 1 should have high viscosity, so that the film 1 and the board 6 can be softened to the same level when heated prior to a vacuum forming as described later.

FIFTH PROCESS STEP: AIR MOLDING

The preferred vacuum forming process will now be explained with reference to FIG. 1E. Instead of vacuum forming, a blow molding process could be used. In the vacuum forming process, a mold 10 comprising an upper mold 10a and a lower mold 10b is used. The mold 10 also comprises multiple pores 11 for exhausting air. The upper mold 10a includes an inlet 14 and a chamber 12a, and the lower mold 10b contains a chamber 12b connected to a vacuum pump 13. The mold 10 is also provided with a far infrared heater (not shown) for heating the film 1 and the board 6 prior to vacuum forming. In operation, the film 1, which is disposed over the board 6 with the conducting portion 2 adjacent to the board 6 as shown in FIG. 1D, is first placed in the mold 10. Specifically, the film 1 and the board 6 are held between the upper mold 10a and the lower mold 10b. Subsequently, the film 1 and the board 6 in the mold 10 are heated for 5 minutes at 200° C. by the far infrared heater. Air is forced from the inlet 14 through the chamber 12a of the upper mold 10a onto the top surface of the film 1. Simultaneously, the vacuum pump 13 is operated to evacuate air from the chamber 12b of the lower mold 10b. A three-dimensional circuit substrate 15 is thus molded.

SIXTH PROCESS STEP: EXTRACTING

Subsequently, the three-dimensional circuit substrate 15 is cooled for 0.25 hour and is extracted from the mold 10. After extracting, unnecessary portions are removed from the three-dimensional circuit substrate 15. Consequently, the three-dimensional circuit substrate 15 has a desired configuration, as shown in FIG. 1F.

The three-dimensional circuit substrate 15 completed through the above process steps comprises the film 1 and the board 6 heat-bonded together over the extents thereof, as shown in FIG. 2. The conducting portion 2 and the resisting portion 3 are sealed between the film 1 and the board 6. The conducting portion 2 is exposed to the outside through the holes 5.

In the preferred embodiment, by overlapping and bonding the film 1 having the conducting portion 2 formed thereon and the board 6 closely through an air molding process such as blow molding or vacuum forming, the three-dimensional circuit substrate 15 is easily formed. The three-dimensional circuit substrate 15 having the complicated configuration can be manufactured easily with a minimum number of process steps and reduced cost. Therefore, the method in the preferred embodiment is appropriate for the mass production of three-dimensional circuit substrates. Since the conducting portion 2 is covered with the film 1 except the holes 5, no insulating membrane is required. Further, a complicated and dense circuit pattern can be formed only by repeating the printing process steps, without requiring another mold.

This invention has been described above with reference to a preferred embodiment as shown in the drawings. Modifications and alterations may become apparent to one skilled in the art upon reading and understanding the specification. Despite the use of a single embodiment for illustration purposes, however, it is intended that all such modifications and alterations be included within the scope and spirit of the appended claims.

Wherefore, having thus described the present invention, what is claimed is:

1. A method of manufacturing a three-dimensional circuit substrate comprising the steps of:
    a) forming a conducting portion on a surface of a film member;
    b) placing the film member over a resin member with the conducting portion adjacent to the resin member;
    c) placing the film member and the resin member in a three-dimensional mold of the desired shape for the three-dimensional circuit substrate; and,
    d) applying heat and air pressure simultaneously to the film member and the resin member to shape, overlap and heat-bond the film member and the resin member together as a three-dimensional circuit substrate.

2. The method of manufacturing a three-dimensional circuit substrate of claim 1 wherein:
    said steps of placing the film member and the resin member in a three-dimensional mold and applying heat and air pressure simultaneously to the film member and the resin member to shape, overlap and heat-bond the film member and the resin member together comprise a blow molding process.

3. The method of manufacturing a three-dimensional circuit substrate of claim 1 wherein:
    said steps of placing the film member and the resin member in a three-dimensional mold and applying heat and air pressure simultaneously to the film member and the resin member to shape, overlap and heat-bond the film member and the resin member together comprise a vacuum forming process.

4. A method of manufacturing a three-dimensional circuit substrate comprising the steps of:
    a) forming through holes in a film of a resin material at points of intended electrical connection thereto;
    b) forming conducting circuit portions on a surface of the film interconnecting the through holes;
    c) placing the film over a planar member of the resin material with the surface containing the conducting circuit portions adjacent to a surface of the planar member;
    d) placing the film and the planar member in combination into a three-dimensional mold of the desired shape for the three-dimensional circuit substrate; and,
    e) applying heat and air pressure simultaneously to the film and the planar member to shape, overlap and heat-bond the film and the planar member together as a three-dimensional circuit substrate.

5. The method of manufacturing a three-dimensional circuit substrate of claim 4 wherein:
    said steps of placing the film and the planar member in a three dimensional mold and applying heat and air pressure simultaneously to the film and the planar member to shape, overlap and heat-bond the film and the planar member together comprise a blow molding process.

6. The method of manufacturing a three-dimensional circuit substrate of claim 4 wherein:
    said steps of placing the film and the planar member in a three-dimensional mold and applying heat and air pressure simultaneously to the film and the planar member to shape, overlap and heat-bond the film and the planar member together comprise a vacuum forming process.

7. The method of manufacturing a three-dimensional circuit substrate of claim 4 wherein:
said step of forming conducting circuit portions on a surface of the film interconnecting the through holes comprises silkscreening the conducting circuit portions on the surface of the film with a conducting ink.

8. A method of manufacturing a three-dimensional circuit substrate comprising the steps of:
a) forming through holes in a film of a resin material at points of intended electrical connection thereto;
b) forming conducting circuit portions on a surface of the film interconnecting the through holes by silkscreening the conducting circuit portions on the surface of the film with a conducting ink;
c) placing the film over a planar member of the resin material with the surface containing the conducting circuit portions adjacent to a surface of the planar member;
d) placing the film and the planar member in combination into a three-dimensional mold of the desired shape for the three-dimensional circuit substrate; and,
e) applying heat and air pressure simultaneously to the film and the planar member in a blow molding process to shape, overlap and heat-bond the film and the planar member together as a three-dimensional circuit substrate.

9. A method of manufacturing a three-dimensional circuit substrate comprising the steps of:
a) forming through holes in a film of a resin material at points of intended electrical connection thereto;
b) forming conducting circuit portions on a surface of the film interconnecting the through holes by silkscreening the conducting circuit portions on the surface of the film with a conducting ink;
c) placing the film over a planar member of the resin material with the surface containing the conducting circuit portions adjacent to a surface of the planar member;
d) placing the film and the planar member in combination into a three-dimensional mold of the desired shape for the three-dimensional circuit substrate; and,
e) applying heat and air pressure simultaneously to the film and the planar member in a vacuum forming process to shape, overlap and heat-bond the film and the planar member together as a three-dimensional circuit substrate.

* * * * *